United States Patent
Huang et al.

(10) Patent No.: US 12,537,490 B2
(45) Date of Patent: Jan. 27, 2026

(54) AMPLIFIER AND METHOD FOR CONTROLLING COMMON MODE VOLTAGE OF THE SAME

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 473 days.

(21) Appl. No.: 18/154,822

(22) Filed: Jan. 14, 2023

(65) Prior Publication Data

US 2023/0246613 A1  Aug. 3, 2023

(30) Foreign Application Priority Data

Jan. 28, 2022  (TW) .................................. 111104176

(51) Int. Cl.
*H03F 3/45*  (2006.01)
*H03F 1/22*  (2006.01)

(52) U.S. Cl.
CPC ......... *H03F 3/45385* (2013.01); *H03F 1/226* (2013.01); *H03F 3/45632* (2013.01)

(58) Field of Classification Search
CPC .. H03F 3/45385; H03F 1/226; H03F 3/45632; H03F 2203/45551; H03F 2203/45586; H03F 2203/45616; H03F 3/45645; H03F 3/45237

USPC .................................................. 330/253, 258
See application file for complete search history.

(56) References Cited

U.S. PATENT DOCUMENTS

| | | | |
|---|---|---|---|
| 8,928,406 B2 | 1/2015 | Albinet | |
| 2014/0197887 A1* | 7/2014 | Hovesten | H03F 3/45654 330/255 |
| 2019/0013817 A1 | 1/2019 | Koli | |
| 2019/0173478 A1 | 6/2019 | Monangi et al. | |

OTHER PUBLICATIONS

Custódio, J. R., Figueiredo, M., Santin, E., Goes, J. (2010). A CMOS inverter-based self-biased fully differential amplifier. IFIP Advances in Information and Communication Technology, 541-548. https://doi.org/10.1007/978-3-642-11628-5_60.

(Continued)

*Primary Examiner* — Andrea Lindgren Baltzell
*Assistant Examiner* — Khiem D Nguyen
(74) *Attorney, Agent, or Firm* — WPAT, P.C.; Anthony King

(57) ABSTRACT

The present application discloses an amplifier and a method for controlling a common mode voltage thereof. The method includes: generating a control signal according to a positive-terminal input signal, a negative-terminal input signal and a target common mode voltage; and coupling the controlling signal to a first terminal of a positive-terminal capacitor and a first terminal of a negative-terminal capacitor, to adjust degree of conduction of a positive-terminal p-type transistor and degree of conduction of a negative-terminal p-type transistor, or to adjust degree of conduction of a positive-terminal n-type transistor and degree of conduction of a negative-terminal n-type transistor, thereby changing a common mode voltage.

20 Claims, 5 Drawing Sheets

(56) References Cited

OTHER PUBLICATIONS

Office Action and Cited References dated on Sep. 5, 2022 issued by the Taiwan Intellectual Property Office for the Taiwan application 111104177.
English abstract translation of the office action dated on Sep. 5, 2022 issued by the Taiwan Intellectual Property Office for the Taiwan application 111104177.
Teo, T. H., Khoo, E.-S., Uday, D., & Tear, C.-B. (n.d.). Design, analysis, and implementation of analog complex filter for low-if wireless LAN application. 17th International Conference on VLSI Design. Proceedings. https://doi.org/10.1109/icvd.2004.1260958.
Custódio, J. R., Figueiredo, M., Santin, E., & Goes, J. (2010). A CMOS inverter-based self-biased fully differential amplifier. IFIP Advances in Information and Communication Technology, 541-548. https://doi.org/10.1007/978-3-642-11628-5_60.

* cited by examiner

1

AMPLIFIER AND METHOD FOR CONTROLLING COMMON MODE VOLTAGE OF THE SAME

CROSS-REFERENCE TO RELATED APPLICATIONS

This application claims priority of Taiwan application No. 111104176 filed on Jan. 28, 2022, which is incorporated by reference in its entirety.

TECHNICAL FIELD

The present application relates to a circuit, particularly to an amplifier and a method for controlling a common mode voltage of the same.

BACKGROUND

When the common mode voltage of a differential amplifier deviates from the preset value, the output dynamic range is compressed. Moreover, as the process advances, the operating voltage becomes lower and lower. Therefore, how to effectively adjust the common-mode voltage of the amplifier without cascoding additional transistor has become one of the most important issues in this field.

SUMMARY OF THE INVENTION

The present application provides an amplifier, comprising: a positive-terminal p-type transistor; a negative-terminal p-type transistor; a positive-terminal n-type transistor, wherein the positive-terminal p-type transistor and the positive-terminal n-type transistor are cascoded between a first reference voltage and a second reference voltage, a drain of the positive-terminal n-type transistor is coupled to a drain of the positive-terminal p-type transistor and outputs a positive-terminal output signal; a negative-terminal n-type transistor, wherein the negative-terminal p-type transistor and the negative-terminal n-type transistor are cascoded between the first reference voltage and the second reference voltage, and a drain of the negative-terminal n-type transistor is coupled to a drain of the negative-terminal p-type transistor and outputs a negative-terminal output signal; a first positive-terminal capacitor, coupled between a gate of the positive-terminal p-type transistor and a gate of the positive-terminal n-type transistor; a first negative-terminal capacitor, coupled between a gate of the negative-terminal p-type transistor and a gate of the negative-terminal n-type transistor; and a first control circuit, configured to generate a first control signal to a first terminal of the first positive-terminal capacitor and a first terminal of the first negative-terminal capacitor according to the positive-terminal output signal, the negative-terminal output signal and the target common mode voltage; wherein a positive-terminal input signal of the amplifier is input from a second terminal of the first positive-terminal capacitor, and a negative-terminal input signal of the amplifier is input from a second terminal of the first negative-terminal capacitor.

The present application provides a method for controlling a common mode voltage of an amplifier, wherein the amplifier includes: a positive-terminal p-type transistor; a negative-terminal p-type transistor; a positive-terminal n-type transistor, wherein the positive-terminal p-type transistor and the positive-terminal n-type transistor are cascoded between a first reference voltage and a second reference voltage, a drain of the positive-terminal n-type transistor is coupled to a drain of the positive-terminal p-type transistor and outputs a positive-terminal output signal; a negative-terminal n-type transistor, wherein the negative-terminal p-type transistor and the negative-terminal n-type transistor are cascoded between the first reference voltage and the second reference voltage, and a drain of the negative-terminal n-type transistor is coupled to a drain of the negative-terminal p-type transistor and outputs a negative-terminal output signal; a first positive-terminal capacitor, coupled between a gate of the positive-terminal p-type transistor and a gate of the positive-terminal n-type transistor; a first negative-terminal capacitor, coupled between a gate of the negative-terminal p-type transistor and a gate of the negative-terminal n-type transistor; and wherein a positive-terminal input signal of the amplifier is input from a second terminal of the first positive-terminal capacitor, and a negative-terminal input signal of the amplifier is input from a second terminal of the first negative-terminal capacitor; and the method includes: generating a first control signal according to according to the positive-terminal output signal, the negative-terminal output signal and the target common mode voltage; and coupling the controlling signal to a first terminal of the first positive-terminal capacitor and a first terminal of the first negative-terminal capacitor, so as to adjust degree of conduction of the positive-terminal p-type transistor and degree of conduction of the negative-terminal p-type transistor, or to adjust degree of conduction of the positive-terminal n-type transistor and degree of conduction of the negative-terminal n-type transistor, thereby changing a common mode voltage of the positive-terminal output signal and the negative-terminal output signal.

The present application is able to effectively adjust the common-mode voltage of the amplifier without cascoding additional transistor.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
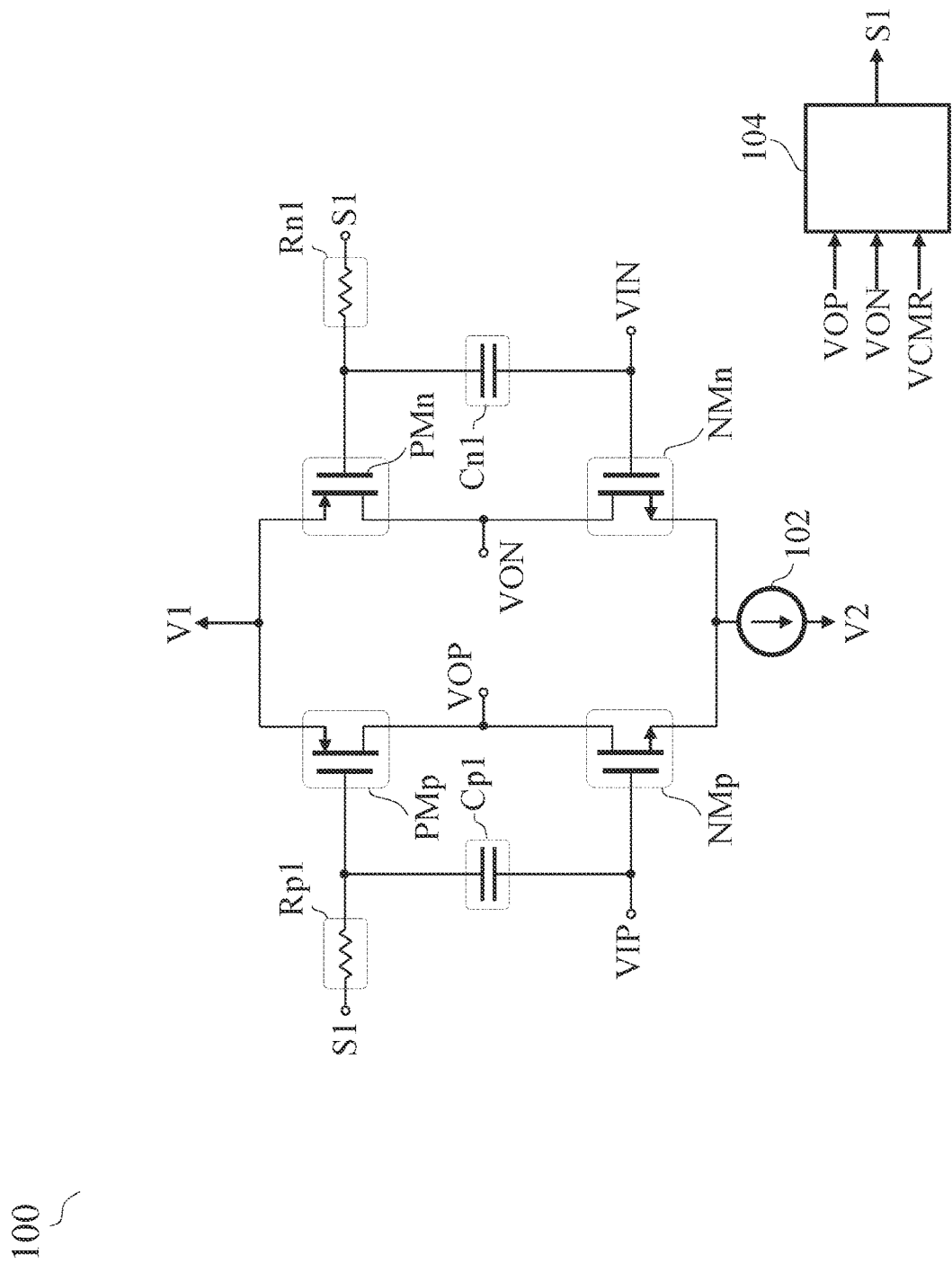
FIG. 1 is a schematic diagram illustrating an amplifier according to the first embodiment of the present application.

FIG. 1 is a schematic diagram illustrating an amplifier according to the first embodiment of the present application. The amplifier 100 is a continuous time-type amplifier, having an amplifier main body consisting of a positive-terminal p-type transistor PMp, a negative-terminal p-type transistor PMn, a positive-terminal n-type transistor NMp, a negative-terminal n-type transistor NMn, a positive-terminal the capacitor Cp1, a negative-terminal the capacitor Cn1 and a current source 102. In this case, the positive-terminal p-type transistor PMp, the positive-terminal n-type transistor NMp and the current source 102 are cascoded between the reference voltage V1 and the reference voltage V2; the negative-terminal p-type transistor PMn, the negative-terminal n-type transistor NMn and the current source 102 are cascoded between the reference voltage V1 and the reference voltage V2. In particular, the drain of the positive-terminal p-type transistor PMp is coupled to the drain of the positive-terminal n-type transistor NMp; the drain of the negative-terminal p-type transistor PMn coupled to the negative-terminal n-type transistor NMn. The positive-terminal the capacitor Cp1 is coupled between the gate of the positive-terminal p-type transistor PMp and the positive-terminal n-type transistor NMp; the negative-terminal the capacitor Cn1 is coupled between the gate of the negative-terminal p-type transistor PMn and the negative-terminal n-type transistor NMn.

In the present embodiment, the reference voltage V1 is greater than the reference voltage V2, and the reference voltage V2 is the ground voltage. The differential input signal pair of the amplifier 100 includes a positive-terminal input signal VIP and a negative-terminal input signal VIN, respectively coupled to the gate of the positive-terminal n-type transistor NMp and the gate of the negative-terminal n-type transistor NMn, and respectively coupled to the gate of the positive-terminal p-type transistor PMp and the gate of the negative-terminal p-type transistor PMn via the positive-terminal the capacitor Cp1 and the negative-terminal the capacitor Cn1; the differential output signal pair includes a positive-terminal output signal VOP and a negative-terminal output signal VON, respectively outputting from the drain of the positive-terminal p-type transistor PMp and the drain of the negative-terminal p-type transistor PMn.

Generally, the conductivities of the positive-terminal n-type transistor NMp, the negative-terminal n-type transistor NMn, the positive-terminal p-type transistor PMp and the negative-terminal p-type transistor PMn are determined at the beginning of the circuit designing process, such that the common mode voltage of the positive-terminal output signal VOP and the negative-terminal output signal VON is maintained at the target common mode voltage VCMR, e.g., (V1+V2)/2. However, in reality, the conductivity or conduction degree of the positive-terminal n-type transistor NMp and the negative-terminal n-type transistor NMn may be greater than the conductivity or conduction degree of the positive-terminal p-type transistor PMp and the negative-terminal p-type transistor PMn due to changes in the manufacturing process, supply voltage or temperature, such that the common mode voltage deviates from the target common mode voltage VCMR.

Therefore, in the present embodiment, a control circuit 104 is additional arranged in the amplifier 100 to control the degree of conduction of the positive-terminal p-type transistor PMp and the negative-terminal p-type transistor PMn; for example, if the control circuit 104 determines that the common mode voltage is too low, then it can reduce the gate voltage of the positive-terminal p-type transistor PMp and the negative-terminal p-type transistor PMn to increase the degree of conduction of the positive-terminal p-type transistor PMp and the negative-terminal p-type transistor PMn, thereby elevating the common mode voltage; if the control circuit 104 determines that the common mode voltage, then the opposite operation is performed.

In particular, the control circuit 104 generates a control signal S1 according to the positive-terminal output signal VOP, the negative-terminal output signal VON and the target common mode voltage VCMR, wherein the control signal S1 is coupled to the gate of the positive-terminal p-type transistor PMp and the gate of the negative-terminal p-type transistor PMn via a resistor Rp1 and a resistor Rn1 respectively.

The control circuit 104 can obtain the common mode voltage according to the positive-terminal output signal VOP and the negative-terminal output signal VON, and then estimate the control signal S1 according to the common mode voltage and the target common mode voltage VCMR; however, the present embodiment is not limited thereto. In certain embodiments, the control circuit 104 can include a comparator, configured to compare the common mode voltage with the target common mode voltage VCMR, and the control circuit 104 generates the control signal S1 accordingly. In certain embodiments, the control circuit 104 can include an integrator, configured to perform integration on the difference between the common mode voltage and the target common mode voltage VCMR, and the control circuit 104 generates the control signal S1 accordingly.

In certain embodiments, the positive-terminal input signal VIP and the negative-terminal input signal VIN are input from the gate of the positive-terminal p-type transistor PMp and the gate of the negative-terminal p-type transistor PMn, whereas the control signal S1 is coupled to the gate of the positive-terminal n-type transistor NMp and the gate of the negative-terminal n-type transistor NMn via the resistor Rp1 and the resistor Rn1 respectively. That is, the differential input signal pair is input from the gate of the positive-terminal p-type transistor PMp and the gate of the negative-terminal p-type transistor PMn, and the control signal S1 is configured to change the voltage across a capacitor Cp1 and the voltage across a capacitor Cn1, thereby changing the degree of conduction of the positive-terminal n-type transistor NMp and the negative-terminal n-type transistor NMn.

Further, it is only for illustrative purpose that the current source 102 of FIG. 1 is disposed in adjacent to the reference voltage V2; in certain embodiments, the current source 102 can be disposed in adjacent to the reference voltage V1 instead. In certain embodiments, another current source can be disposed in adjacent to the reference voltage V1. In certain embodiments, the current source may be disposed in other ways.

Figure 2:
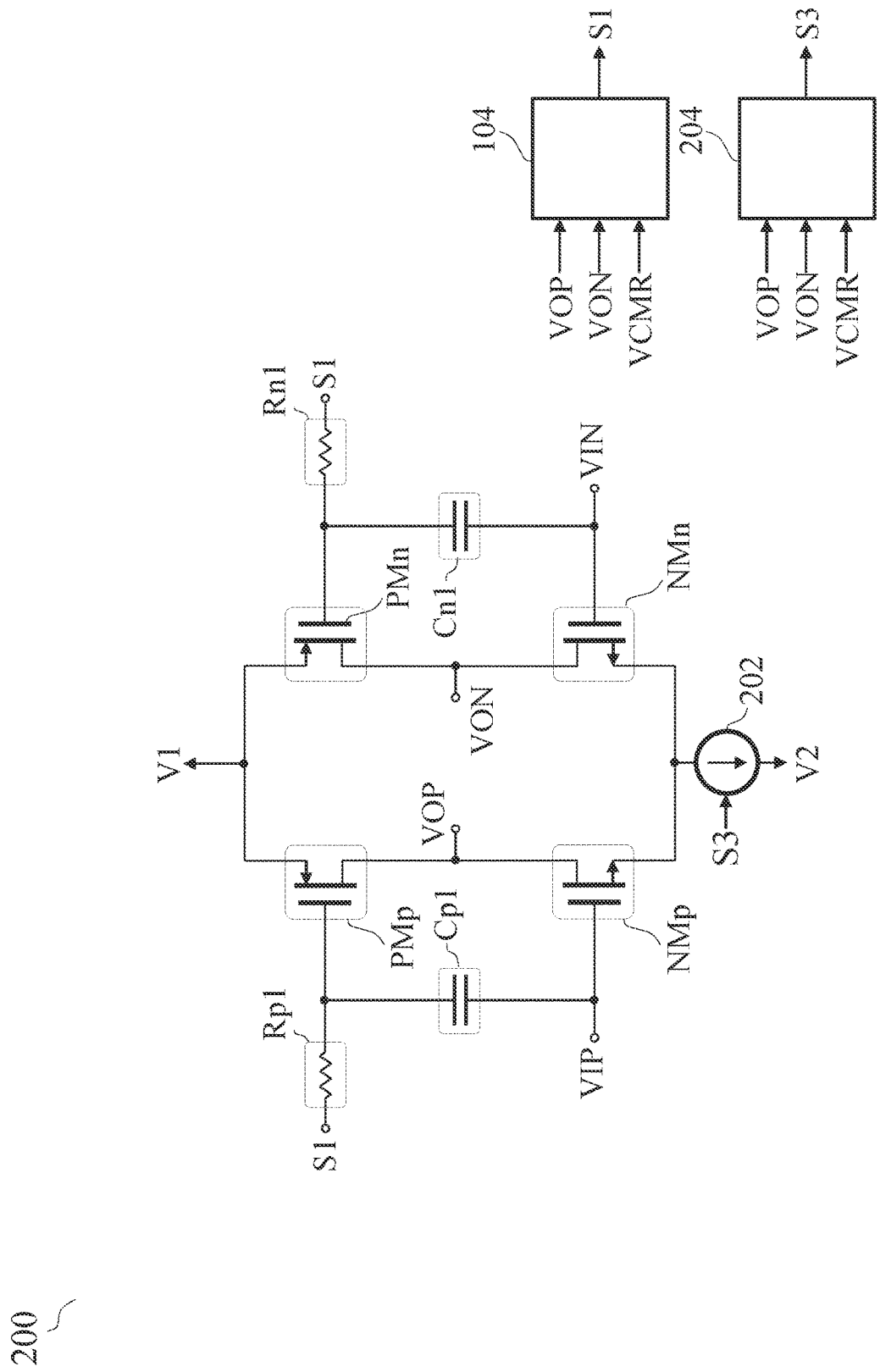
FIG. 2 is a schematic diagram illustrating an amplifier according to the second embodiment of the present application.

The current source 102 of FIG. 1 has a fixed output, but in certain embodiments, it is feasible to coordinately adjust the common mode voltage by controlling the current level supplied by the current source. As shown in FIG. 2; FIG. 2 is a schematic diagram illustrating an amplifier according to the second embodiment of the present application, wherein the amplifier 200 further includes a control circuit 204, configured to generate q control signal S3 according to the positive-terminal output signal VOP, the negative-terminal output signal VON and the target common mode voltage VCMR, wherein the current source 202 of the amplifier 200 dynamically adjust the output current level according to the control signal S3. In the present embodiment, principles for generating the control signal S3 and the control signal S1 are similar, but the calculation details may vary depending on the controlling approach of the current source 202. However, in certain embodiments, the control signal S3 can be the same as the control signal S1, and the two share the control circuit 104. As discussed above, the variations of the position of the current source 102 are also applicable in the adjustable current source 202.

Figure 3:
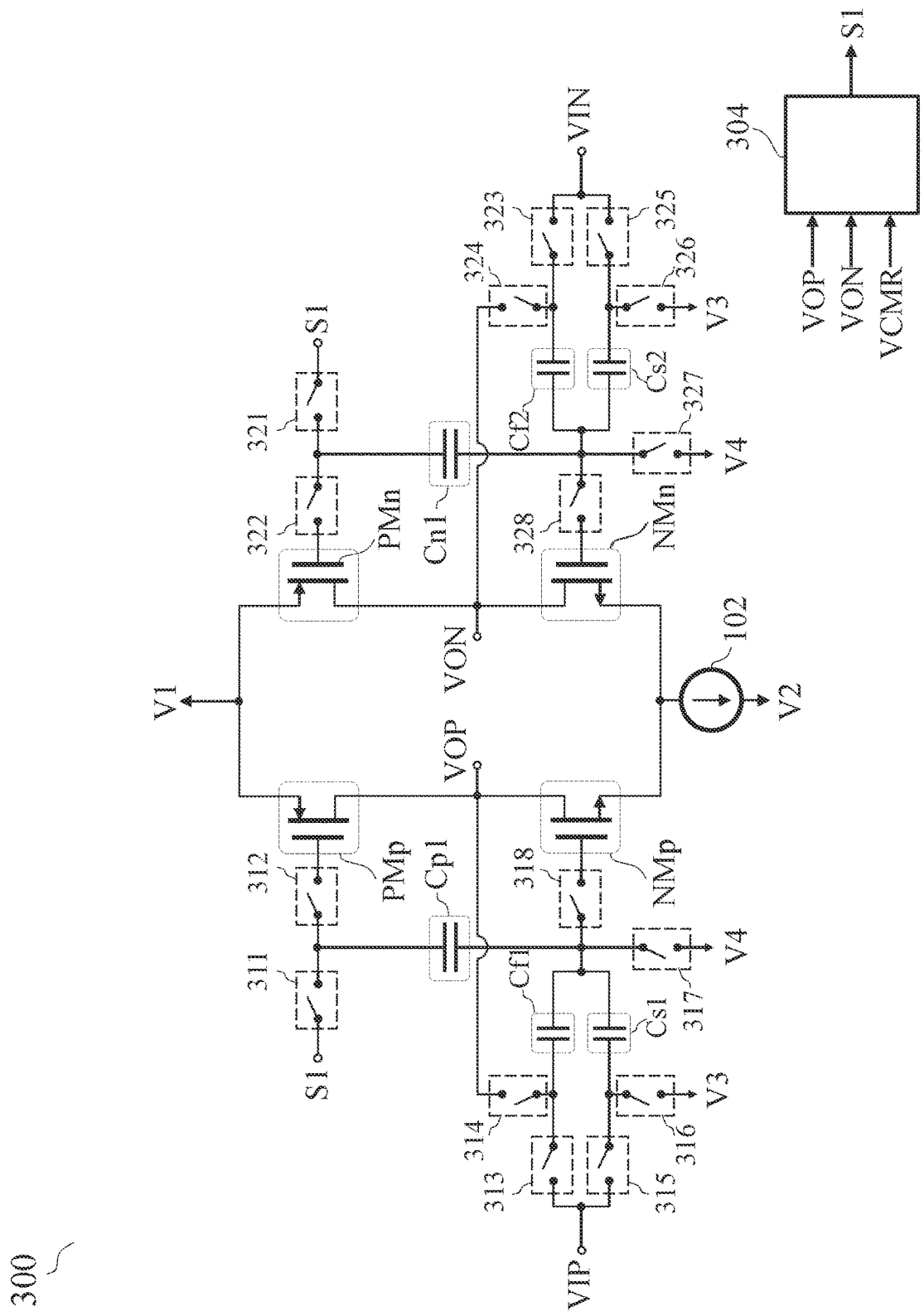
FIG. 3 is a schematic diagram illustrating an amplifier according to the third embodiment of the present application.

FIG. 3 is a schematic diagram illustrating an amplifier according to the third embodiment of the present application. The amplifier 300 and the amplifier 100 differ in that the amplifier 300 is a discrete time-type amplifier, including an amplifier main body consisting of a positive-terminal p-type transistor PMp, a negative-terminal p-type transistor PMn, a positive-terminal n-type transistor NMp, a negative-terminal n-type transistor NMn, a positive-terminal the capacitor Cp1, a negative-terminal the capacitor Cn1, a current source 102, switches 311 to 318, switches 321 to 328, a capacitor Cf1, a capacitor Cs1, a capacitor Cf2 and a capacitor Cs2. In this case, the positive-terminal p-type transistor PMp, the positive-terminal n-type transistor NMp and the current source 102 are cascoded between the reference voltage V1 and the reference voltage V2; the negative-terminal p-type transistor PMn, the negative-terminal n-type transistor NMn and the current source 102 are cascoded between the reference voltage V1 and the reference voltage V2. In particular, the drain of the positive-terminal p-type transistor PMp is coupled to the drain of the positive-terminal n-type transistor NMp; the drain of the negative-terminal p-type transistor PMn is coupled to the drain of the negative-terminal n-type transistor NMn. The positive-terminal the capacitor Cp1 is coupled between the gate of the positive-terminal p-type transistor PMp and the positive-terminal n-type transistor NMp via the switch 312 and the switch 318; the negative-terminal the capacitor Cn1 is coupled between the gate of the negative-terminal p-type transistor PMn and the negative-terminal n-type transistor NMn via the switch 322 and the switch 328.

In the present embodiment, the reference voltage V1 is greater than the reference voltage V2, and the reference voltage V2 is the ground voltage. The differential input signal pair of the amplifier 100 includes a positive-terminal input signal VIP and a negative-terminal input signal VIN, wherein the positive-terminal input signal VIP is coupled to the gate of the positive-terminal n-type transistor NMp via the switch 313, the switch 315, the capacitor Cf1, the capacitor Cs1 and the switch 318, and the negative-terminal input signal VIN is coupled to the gate of the negative-terminal n-type transistor NMn via the switch 323, the switch 325, the capacitor Cf2, the capacitor Cs2 and the switch 328. The differential output signal pair includes a positive-terminal output signal VOP and a negative-terminal output signal VON, respectively output from the drain of the positive-terminal p-type transistor PMp and the drain of the negative-terminal p-type transistor PMn. The control signal S1 is coupled to the gate of the positive-terminal p-type transistor PMp via the switch 311 and the switch 312, and is coupled to the gate of the negative-terminal p-type transistor PMn via the switch 321 and the switch 322.

The switch 314 is coupled between the capacitor Cf1 and the positive-terminal output signal VOP, the switch 324 is coupled between the capacitor Cf2 and the negative-terminal output signal VON, the switch 316 is coupled between the capacitor Cs1 and the reference voltage V3, the switch 326 is coupled between the capacitor Cs2 and the reference voltage V3, the switch 317 is coupled between the capacitor Cp1 and the reference voltage V4, the switch 327 is coupled between the capacitor Cn1 and the reference voltage V4.

In this case, the switch 311, the switch 313, the switch 315, the switch 317, the switch 321, the switch 323, the switch 325 and the switch 327 are conducted during a first time period; the switch 312, the switch 314, the switch 316, the switch 318, the switch 322, the switch 324, the switch 326 and the switch 328 are conducted during a second time period, wherein the first time period and the second time period do not overlap.

The principles of the control circuit 304 and the controller 104 are the same or similar, but the control circuit 304 may be a discrete time-type circuit, and the controller 104 may be a continuous time-type circuit.

Figure 4:
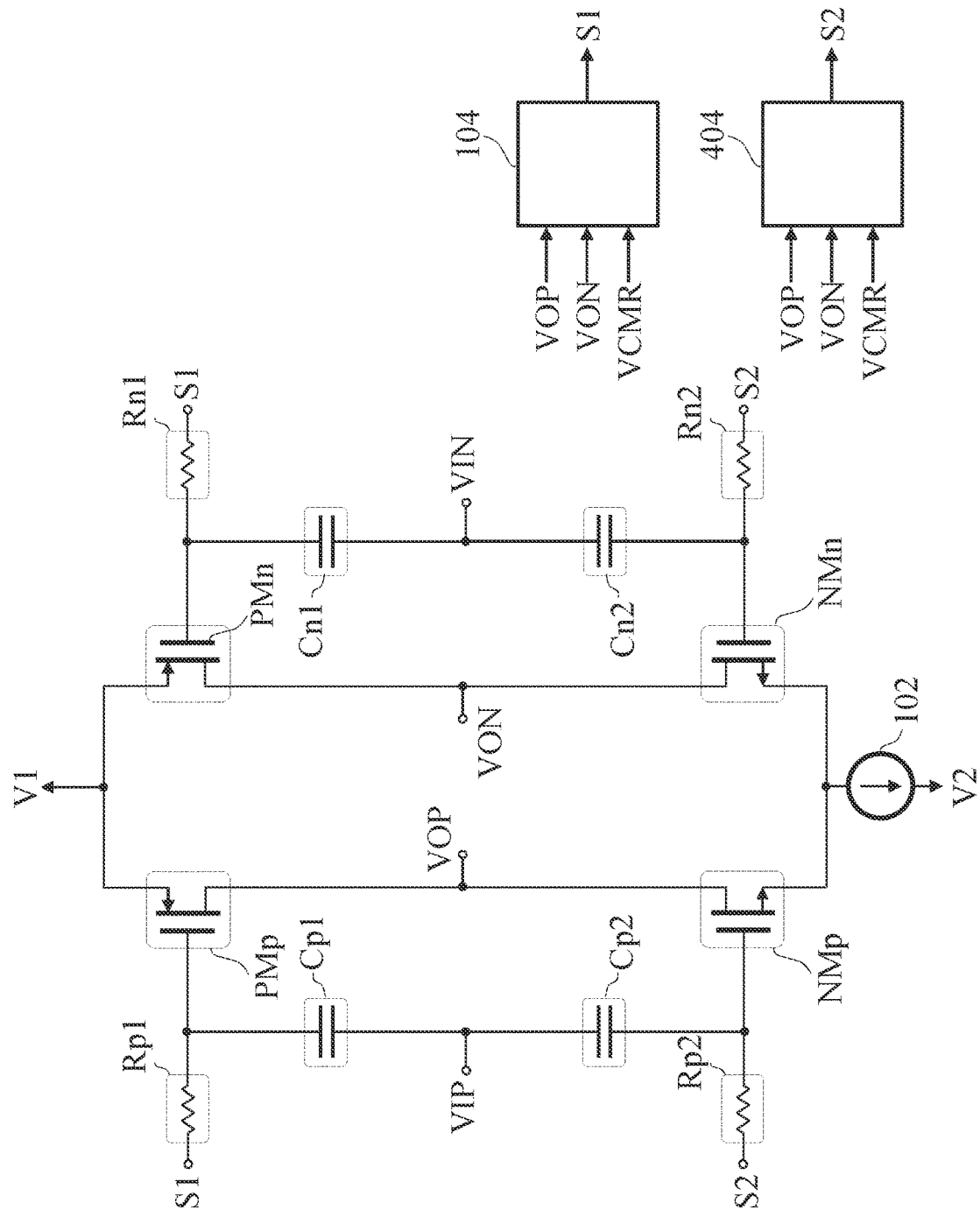
FIG. 4 is a schematic diagram illustrating an amplifier according to the fourth embodiment of the present application.

FIG. 4 is a schematic diagram illustrating an amplifier according to the fourth embodiment of the present application. The amplifier 400 and the amplifier 100 differ in that the amplifier 400 additionally includes a capacitor Cp2, a capacitor Cn2, a resistor Rp2 and a resistor Rn2. In this case, the capacitor Cp1 is serially connected with the capacitor Cp2, the positive-terminal input signal VIP is input between the capacitor Cp1 and the capacitor Cp2; the capacitor Cn1 is serially connected with the capacitor Cn2, the negative-terminal input signal VIN is input between the capacitor Cn1 and the capacitor Cn2. An additional control signal S2 is coupled to the gate of the positive-terminal n-type transistor NMp and the gate of the negative-terminal n-type transistor NMn via the resistor Rp2 and the resistor Rn2, respectively. That is, the control signal S2 is configured to change the voltage across the capacitor Cp2 and the voltage across the capacitor Cn2, thereby changing the degree of conduction of the positive-terminal n-type transistor NMp and the negative-terminal n-type transistor NMn.

In this way, the degree of conduction of the positive-terminal p-type transistor PMp and the negative-terminal p-type transistor PMn can be changed by the control signal S; the degree of conduction of the positive-terminal n-type transistor NMp and the negative-terminal n-type transistor NMn can be changed by the control signal S2. In this way, the common mode voltage can be adjusted more efficiently.

The capacitor Cp1 may be the same as or different from the capacitor Cp2; the capacitor Cn1 may be the same as or different from the capacitor Cn2. The principles of generating the control signal S2 and the control signal S1 are similar; that is, the principles of the control circuit 404 and the controller 104 are the same or similar, but the calculation details may vary. However, in certain embodiments, the control signal Ss can be the same as the control signal S1, and the two share the control circuit 104. In certain embodiments, the control signal S1 or the control signal S2 in FIG. 4 can be replaced with a fixed reference voltage.

Figure 5:
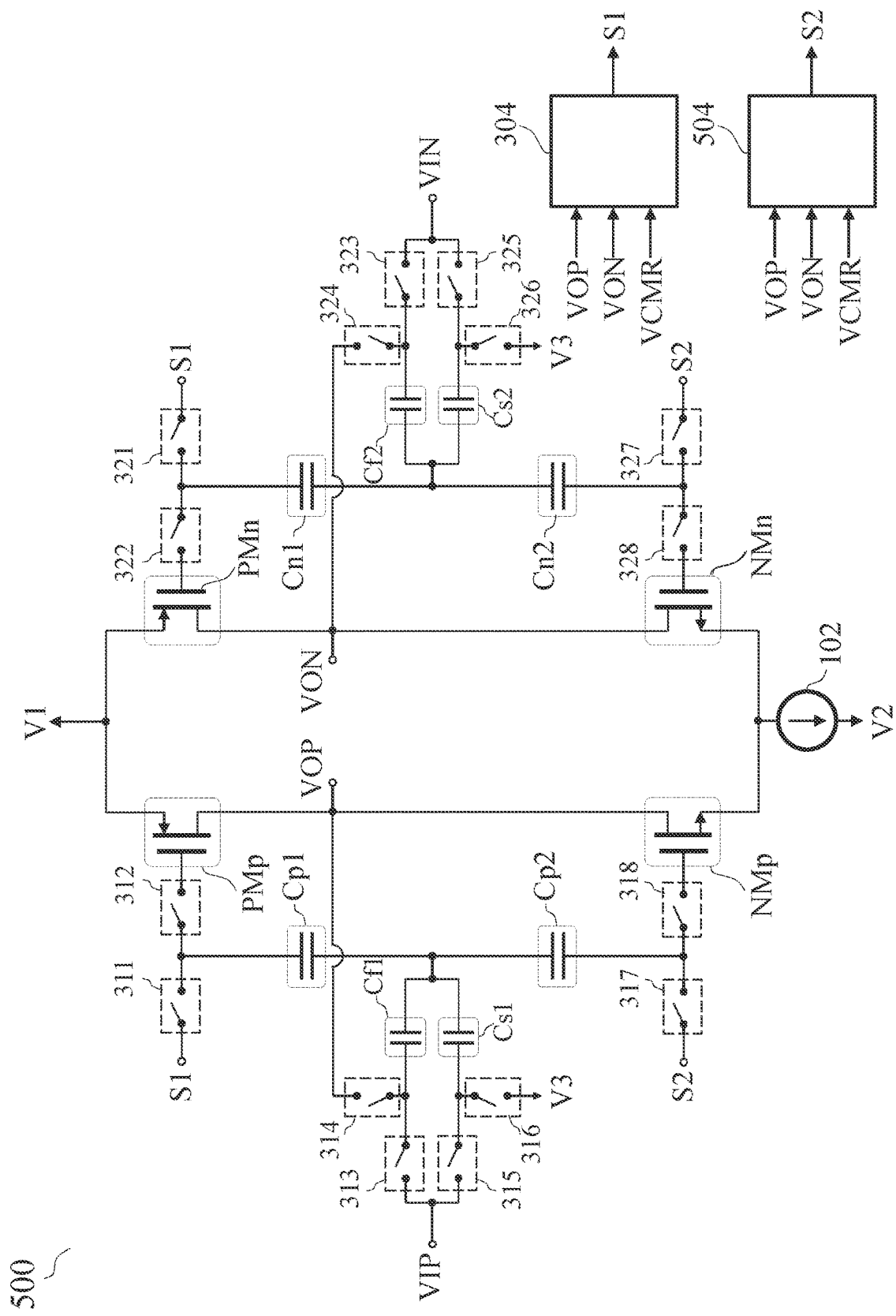
FIG. 5 is a schematic diagram illustrating an amplifier according to the fifth embodiment of the present application.

FIG. 5 is a schematic diagram illustrating an amplifier according to the fifth embodiment of the present application. The amplifier 500 and the amplifier 400 differ in that the amplifier 500 is a discrete time-type amplifier, and the implementing details thereof combine those of the amplifier 300 and the amplifier 400. The principles of the control circuit 504 and the controller 404 may be the same or similar, but the control circuit 504 can be a discrete time-type circuit, and the controller 404 can be a continuous time-type circuit.

What is claimed is:

1. An amplifier, comprising:
a positive-terminal p-type transistor;
a negative-terminal p-type transistor;
a positive-terminal n-type transistor, wherein the positive-terminal p-type transistor and the positive-terminal n-type transistor are stacked between a first reference voltage and a second reference voltage, a drain of the positive-terminal n-type transistor is coupled to a drain of the positive-terminal p-type transistor and outputs a positive-terminal output signal;
a negative-terminal n-type transistor, wherein the negative-terminal p-type transistor and the negative-terminal n-type transistor are stacked between the first reference voltage and the second reference voltage, and a drain of the negative-terminal n-type transistor is coupled to a drain of the negative-terminal p-type transistor and outputs a negative-terminal output signal;

a first positive-terminal capacitor, coupled between a gate of the positive-terminal p-type transistor and a gate of the positive-terminal n-type transistor;

a first negative-terminal capacitor, coupled between a gate of the negative-terminal p-type transistor and a gate of the negative-terminal n-type transistor; and a first control circuit, configured to generate a first control signal to a first terminal of the first positive-terminal capacitor and a first terminal of the first negative-terminal capacitor according to the positive-terminal output signal, the negative-terminal output signal and a target common mode voltage, wherein a positive-terminal input signal of the amplifier is input from a second terminal of the first positive-terminal capacitor, and a negative-terminal input signal of the amplifier is input from a second terminal of the first negative-terminal capacitor.

2. The amplifier of claim 1, wherein the amplifier is a continuous time amplifier, and the amplifier further comprises a positive-terminal resistor and negative-terminal resistor, wherein the first control signal reaches the first terminal of the first positive-terminal capacitor through the positive-terminal resistor, and the first control signal reaches the first terminal of the first negative-terminal capacitor through the negative-terminal resistor.

3. The amplifier of claim 1, wherein the amplifier is a discrete time amplifier, and the amplifier further comprises a first switch and a second switch, wherein the first control signal reaches the first terminal of the first positive-terminal capacitor through the first switch, and the first control signal reaches the first terminal of the first negative-terminal capacitor through the second switch.

4. The amplifier of claim 1, further comprising:
a second positive-terminal capacitor, serially connected between a gate of the positive-terminal p-type transistor and a gate of the positive-terminal n-type transistor with the first positive-terminal capacitor, wherein a second terminal of the second positive-terminal capacitor is coupled to the second terminal of the first positive-terminal capacitor; and
a second negative-terminal capacitor, serially connected between a gate of the negative-terminal p-type transistor and a gate of the negative-terminal n-type transistor with the first negative-terminal capacitor, wherein a second terminal of the second negative-terminal capacitor is coupled to the second terminal of the first negative-terminal capacitor.

5. The amplifier of claim 4, wherein a second control signal is further generated to a first terminal of the second positive-terminal capacitor and a first terminal of the second negative-terminal capacitor.

6. The amplifier of claim 4, further comprising a second control circuit, configured to generate a second control signal to a first terminal of the second positive-terminal capacitor and a first terminal of the second negative-terminal capacitor according to the positive-terminal output signal, the negative-terminal output signal and the target common mode voltage.

7. The amplifier of claim 1, wherein the first control circuit compares a common mode voltage of the positive-terminal output signal and the negative-terminal output signal with the target common mode voltage to generate the first control signal.

8. The amplifier of claim 1, wherein the first control circuit performs integration on a difference between the common mode voltage of the positive-terminal output signal and the negative-terminal output signal and the target common mode voltage to generate the first control signal.

9. The amplifier of claim 1, further comprising:
a third control circuit, configured to generate a third control signal according to the positive-terminal output signal, the negative-terminal output signal and the target common mode voltage; and
a current source, configured to adjust the level of an output current according to the third control signal.

10. The amplifier of claim 1, further comprising a current source, wherein the current source outputs a fixed current.

11. A method for controlling a common mode voltage of an amplifier, wherein the amplifier comprises:
a positive-terminal p-type transistor;
a negative-terminal p-type transistor;
a positive-terminal n-type transistor, wherein the positive-terminal p-type transistor and the positive-terminal n-type transistor are stacked between a first reference voltage and a second reference voltage, a drain of the positive-terminal n-type transistor is coupled to a drain of the positive-terminal p-type transistor and outputs a positive-terminal output signal;
a negative-terminal n-type transistor, wherein the negative-terminal p-type transistor and the negative-terminal n-type transistor are stacked between the first reference voltage and the second reference voltage, and a drain of the negative-terminal n-type transistor is coupled to a drain of the negative-terminal p-type transistor and outputs a negative-terminal output signal;
a first positive-terminal capacitor, coupled between a gate of the positive-terminal p-type transistor and a gate of the positive-terminal n-type transistor;
a first negative-terminal capacitor, coupled between a gate of the negative-terminal p-type transistor and a gate of the negative-terminal n-type transistor; and
wherein a positive-terminal input signal of the amplifier is input from a second terminal of the first positive-terminal capacitor, and a negative-terminal input signal of the amplifier is input from a second terminal of the first negative-terminal capacitor; and
the method comprises:
generating a first control signal according to according to the positive-terminal output signal, the negative-terminal output signal and a target common mode voltage; and
coupling the controlling signal to a first terminal of the first positive-terminal capacitor and a first terminal of the first negative-terminal capacitor, so as to adjust degree of conduction of the positive-terminal p-type transistor and degree of conduction of the negative-terminal p-type transistor, or to adjust degree of conduction of the positive-terminal n-type transistor and degree of conduction of the negative-terminal n-type transistor, thereby changing a common mode voltage of the positive-terminal output signal and the negative-terminal output signal.

12. The method of claim 11, wherein the amplifier is a continuous time amplifier, and the amplifier further comprises a positive-terminal resistor and a negative-terminal resistor, wherein the first control signal reaches the first terminal of the first positive-terminal capacitor through the positive-terminal resistor, and the first control signal reaches the first terminal of the first negative-terminal capacitor through the negative-terminal resistor.

13. The method of claim 11, wherein the amplifier is a discrete time amplifier, and the amplifier further comprises a first switch and a second switch, wherein the first control signal reaches the first terminal of the first positive-terminal capacitor through the first switch, and the first control signal reaches the first terminal of the first negative-terminal capacitor through the second switch.

14. The method of claim 11, wherein the amplifier further comprises:
   a second positive-terminal capacitor, serially connected between a gate of the positive-terminal p-type transistor and a gate of the positive-terminal n-type transistor with the first positive-terminal capacitor, wherein a second terminal of the second positive-terminal capacitor is coupled to the second terminal of the first positive-terminal capacitor; and
   a second negative-terminal capacitor, serially connected between a gate of the negative-terminal p-type transistor and a gate of the negative-terminal n-type transistor with the first negative-terminal capacitor, wherein a second terminal of the second negative-terminal capacitor is coupled to the second terminal of the first negative-terminal capacitor.

15. The method of claim 14, further comprising:
   coupling a second control signal to a first terminal of the second positive-terminal capacitor and a first terminal of the second negative-terminal capacitor.

16. The method of claim 14, further comprising:
   generating a second control signal to a capacitor first terminal of the second positive-terminal and a first terminal of the second negative-terminal capacitor according to the positive-terminal output signal, the negative-terminal output signal and the target common mode voltage.

17. The method of claim 11, wherein the step of generating the first control signal according to the positive-terminal output signal, the negative-terminal output signal and the target common mode voltage comprises:
   comparing a common mode voltage of the positive-terminal output signal and the negative-terminal output signal with the target common mode voltage, to generate the first control signal.

18. The method of claim 11, wherein the step of generating the first control signal according to the positive-terminal output signal, the negative-terminal output signal and the target common mode voltage comprises:
   performing integration on a difference between the common mode voltage of the positive-terminal output signal and the negative-terminal output signal and the target common mode voltage to generate the first control signal.

19. The method of claim 11, wherein the amplifier further comprises a current source, and the method further comprises:
   generating a third control signal according to the positive-terminal output signal, the negative-terminal output signal and the target common mode voltage; and
   adjusting the level of a current output by the current source according to the third control signal.

20. The method of claim 11, wherein the amplifier further comprises a current source, and the current source outputs a fixed current.

* * * * *